(12) United States Patent
Motoroiu et al.

(10) Patent No.: US 10,454,438 B2
(45) Date of Patent: Oct. 22, 2019

(54) DYNAMIC CORRECTION OF GAIN ERROR IN CURRENT-FEEDBACK INSTRUMENTATION AMPLIFIERS

(71) Applicant: Microchip Technology Incorporated, Chandler, AZ (US)

(72) Inventors: Serban Motoroiu, Campina (RO); Jim Nolan, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 15/901,623

(22) Filed: Feb. 21, 2018

(65) Prior Publication Data

US 2018/0323762 A1    Nov. 8, 2018

Related U.S. Application Data

(60) Provisional application No. 62/500,393, filed on May 2, 2017.

(51) Int. Cl.
*H03G 3/30*   (2006.01)
*H03F 3/45*   (2006.01)
(Continued)

(52) U.S. Cl.
CPC .............. *H03G 3/30* (2013.01); *H03F 1/26* (2013.01); *H03F 3/45179* (2013.01);
(Continued)

(58) Field of Classification Search
USPC .................................. 330/252–261, 286, 85
See application file for complete search history.

(56) References Cited

U.S. PATENT DOCUMENTS 6,559,720 B1 * 5/2003 Huijsing ............. H03F 3/45197
330/253
7,091,773 B1 * 8/2006 Brunn ....................... H03F 1/34
330/260
(Continued)

FOREIGN PATENT DOCUMENTS

GB           2334163 A      8/1999   ............... H03G 1/00

OTHER PUBLICATIONS

International Search Report and Written Opinion, Application No. PCT/US2018/029708, 13 pages, dated Jul. 30, 2018.

*Primary Examiner* — Hieu P Nguyen
(74) *Attorney, Agent, or Firm* — Slayden Grubert Beard PLLC

(57) ABSTRACT

A current feed-back instrumentation amplifier (CFIA) comprises a differential pair with degeneration for amplifying small differential voltages in the presence of large common-mode voltages. The CFIA includes input and feedback transconductors and a chopping modulator circuit that continuously swaps tail current sources between the transconductors. This tail current swapping reduces the contribution to the CFIA's gain error caused by random mismatch between the tail currents of the input and feedback transconductors. The modulator circuit operates on a clock cycle to periodically swap the tail current sources. As a result, even if the tail currents are mismatched, on average the tail currents (transconductor gains) will approximately equal out, and the contribution of the tail current difference to the gain error is canceled out.

16 Claims, 10 Drawing Sheets

(51) Int. Cl.
*H03F 1/26* (2006.01)
*H03F 1/36* (2006.01)
*H03G 1/00* (2006.01)

(52) U.S. Cl.
CPC ..... *H03F 3/45183* (2013.01); *H03F 3/45659* (2013.01); *H03G 1/0023* (2013.01); *H03G 1/0029* (2013.01); *H03F 2200/129* (2013.01); *H03F 2200/261* (2013.01); *H03F 2203/45048* (2013.01); *H03F 2203/45392* (2013.01); *H03F 2203/45466* (2013.01); *H03F 2203/45468* (2013.01); *H03F 2203/45504* (2013.01); *H03F 2203/45511* (2013.01); *H03F 2203/45521* (2013.01); *H03F 2203/45528* (2013.01); *H03F 2203/45534* (2013.01)

(56) References Cited

U.S. PATENT DOCUMENTS

| | | | |
|---|---|---|---|
| 2003/0107438 A1 | 6/2003 | Kimura | 330/254 |
| 2006/0132193 A1 | 6/2006 | Tsuchi | 327/65 |
| 2011/0181361 A1 | 7/2011 | Nolan et al. | 330/278 |

\* cited by examiner

DYNAMIC CORRECTION OF GAIN ERROR IN CURRENT-FEEDBACK INSTRUMENTATION AMPLIFIERS

RELATED PATENT APPLICATION

This application claims priority to commonly owned U.S. Provisional Patent Application Ser. No. 62/500,393; filed May 2, 2017; entitled "Dynamic Correction of Gain Error in Current-Feedback Instrumentation Amplifiers," by Serban Motoroiu and Jim Nolan; and is hereby incorporated by reference herein for all purposes.

TECHNICAL FIELD

The present disclosure relates to instrumentation amplifiers, and, more particularly, to dynamically correcting the gain error of an instrumentation amplifier that uses a current-feedback circuit architecture.

BACKGROUND

The gain error, e.g., the difference between the actual transfer function and an ideal transfer function of a current feed-back instrumentation amplifier (CFIA) depends on the accuracy of matching between the CFIA's input transconductor and feedback transconductor. Some existing CFIAs try to address the gain error using an architecture in which each transconductor includes pre-amplifiers to create a transfer function proportional to the ratio between the degeneration resistors of the input and feedback transconductors, see FIG. 1. The advantage of this circuit architecture is that it provides a gain error that depends almost exclusively on matching of resistors which is superior to the matching of transistors. While the preamplifiers provide an overall low gain error, their noise adds to the total noise of the instrumentation amplifier, making this architecture less suitable for low noise designs. Another disadvantage is the presence of feedback loops around each pre-amplifier, which makes frequency compensation rather complex and difficult.

In another approach, the CFIA's transconductors are each based on a differential pair of transistors with degeneration. The noise is significantly lower than the CFIA implementation that uses preamplifiers, and there are no extra feedback loops. However, the gain error will also change: it will now be affected not only by the mismatch between the degeneration resistors of the input and feedback degeneration transconductors, but also by any mismatch between the degenerated differential paired transistors of each transconductor and by any mismatch between the respective tail currents being fed into each transconductor. As noted above, resistors match much better than transistors do, so the transistor mismatch will have a dominant effect on the gain error.

SUMMARY

Therefore, what is needed is a CFIA having a circuit architecture that minimizes the mismatch between other elements, such as the transistors and/or the tail currents.

According to an embodiment, a method for gain error correction in a current-feedback instrumentation amplifier may comprise the steps of: providing an input transconductor may comprise a first differential pair of transistors, first degeneration resistors coupled to the first differential pair of transistors, and a first tail current source; providing a feedback transconductor may comprise a second differential pair of transistors, second degeneration resistors coupled to the second differential pair of transistors, and a second tail current source; and providing a modulator circuit coupled between the first and second tail current sources, and the first and second degeneration resistors; controlling the modulator circuit by alternating first and second phase signals; wherein during the first phase signal may comprise the steps of coupling the first tail current source to the first degeneration resistors and the second tail current source to the second degeneration resistors with the modulator circuit; and wherein during the second phase signal may comprise the steps of coupling the first tail current source to the second degeneration resistors, and the second tail current source to the first degeneration resistors with the modulator circuit.

According to a further embodiment of the method, gain error caused by a difference between the first and second tail current sources may be averaged out during the first and second phases. According to a further embodiment of the method, may comprise the step of coupling the input and feedback transconductors to an amplifier. According to a further embodiment of the method, may comprise the step of coupling a feedback network between an output of the amplifier and inputs of the feedback transconductor. According to a further embodiment of the method, the feedback network may determine gain of the current-feedback instrumentation amplifier.

According to another embodiment, a method for gain error correction in a current-feedback instrumentation amplifier may comprise the steps of: providing an input transconductor may comprise a first differential pair may comprise first and second transistors, first and second tail current sources, and a first degeneration resistor coupled between the first and the second transistors; providing a feedback transconductor may comprise a second differential pair may comprise third and fourth transistors, third and fourth tail current sources, and a first degeneration resistor coupled between the third and the fourth transistors; and providing a first modulator circuit coupled between the first and third tail current sources, and the first and third transistors; providing a second modulator circuit coupled between the second and fourth tail current sources, and the second and fourth transistors; controlling the first and second modulator circuits by alternating first and second phase signals; wherein during the first phase signal may comprise the steps of: coupling the first tail current source to the first transistor and the third tail current source to the third transistor with the first modulator circuit, and coupling the second tail current source to the second transistor and the fourth tail current to the fourth transistor with the second modulator circuit; wherein during the second phase signal may comprise the steps of: coupling the first tail current source to the third transistor and the third tail current source to the first transistor with the first modulator circuit, and coupling the second tail current source to the fourth transistor and the fourth tail current to the second transistor with the second modulator circuit. According to a further embodiment of the method, gain error caused by a difference between the first and second tail current sources may be averaged out during the first and second phases.

According to yet another embodiment, a method for gain error correction in a current-feedback instrumentation amplifier may comprise the steps of: providing an input transconductor may comprise a first differential pair of transistors, and a first tail current source; providing a feedback transconductor may comprise a second differential pair of transistors, and a second tail current source; and providing a modulator circuit coupled between the first and second tail current sources, and the first and second differential pairs of transistors; controlling the modulator circuit by alternating first and second phase signals; wherein during the first phase signal may comprise the steps of coupling the first tail current source to the first differential pair of transistors and the second tail current source to the second differential pair of transistors with the modulator circuit; and wherein during the second phase signal may comprise the steps of coupling the first tail current source to the second differential pair of transistors, and the second tail current source to the first differential pair of transistors with the modulator circuit. According to a further embodiment of the method, gain error caused by a difference between the first and second tail current sources may be averaged out during the first and second phases.

According to still another embodiment, a current-feedback instrumentation amplifier having gain error correction may comprise: an input transconductor that may comprise a first differential pair of transistors, first degeneration resistors coupled to the first differential pair of transistors, and a first tail current source; a feedback transconductor may comprise a second differential pair of transistors, second degeneration resistors coupled to the second differential pair of transistors, and a second tail current source; and a modulator circuit coupled between the first and second tail current sources, and the first and second degeneration resistors; wherein during a first phase state the modulator circuit couples the first tail current source to the first degeneration resistors and the second tail current source to the second degeneration resistors, and wherein during a second phase state the modulator circuit couples the first tail current source to the second degeneration resistors, and the second tail current source to the first degeneration resistors.

According to a further embodiment, gain error caused by a difference between the first and second tail current sources may be averaged out during the first and second phases. According to a further embodiment, an amplifier may have inputs coupled to outputs from the input and feedback transconductors. According to a further embodiment, a feedback network may be coupled between an output of the amplifier and inputs of the feedback transconductor.

According to a further embodiment, the feedback network may comprise: a first feedback resistor; a second feedback resistor; and a voltage reference; the first and second feedback resistors and the voltage reference may be connected in series; a first input of the feedback transconductor may be coupled to a node between the second feedback resistor and the voltage reference; a second input of the feedback transconductor may be coupled to a node between the first feedback resistor and the second feedback resistor; and the output of the amplifier may be coupled to the first feedback resistor; wherein gain may be determined by a ratio of resistance values of the first and second feedback resistors. According to a further embodiment, the input transconductor may have a positive input and a negative input.

According to a further embodiment, the modulator circuit may comprise: a first switch coupled between the first tail current source and the first degeneration resistors; a second switch coupled between the first tail current source and the second degeneration resistors; a third switch coupled between the second tail current source and the first degeneration resistors; and a fourth switch coupled between the second tail current source and the second degeneration resistors; wherein the first and fourth switches may be closed and the second and third switches may be open on a first phase state control signal; and the second and third switches may be closed and the first and fourth switches may be open on a second phase state control signal.

According to a further embodiment, the first and second phase state control signals may be from a clock generator, wherein the first control signal may be at a first logic level and the second control signal may be at a second logic level. According to a further embodiment, the first, second, third and fourth switches may be metal oxide semiconductor field effect transistors (MOSFETs). According to a further embodiment, the MOSFETs may be P-channel MOSFETs. According to a further embodiment, the MOSFETs may be N-channel MOSFETs.

According to a further embodiment, transistors may be coupled at inputs and outputs of the modulator circuit for providing low impedance nodes to maintain substantially equal electrical potentials thereon regardless of input voltages to the input and feedback transconductors. According to a further embodiment, the input and feedback transconductors may be fabricated on an integrated circuit die.

According to another embodiment, a current-feedback instrumentation amplifier having gain error correction may comprise: input transconductor may comprise a differential pair may comprise first and second transistors, first and second tail current sources, and a first degeneration resistor coupled between the first and the second transistors; a feedback transconductor may comprise a differential pair may comprise third and fourth transistors, third and fourth tail current sources, and a first degeneration resistor coupled between the third and the third transistors; and a first modulator circuit coupled between the first and third tail current sources, and the first and third transistors; a second modulator circuit coupled between the second and fourth tail current sources, and the second and fourth transistors; wherein during the first phase signal the first modulator circuit couples the first tail current source to the first transistor and the third tail current source to the third transistor, and the second modulator circuit couples the second tail current source to the second transistor and the fourth tail current to the fourth transistor; wherein during the second phase signal the first modulator circuit couples the first tail current source to the third transistor and the third tail current source to the first transistor, and the second modulator circuit couples the second tail current source to the fourth transistor and the fourth tail current to the second transistor.

According to yet another embodiment, a current-feedback instrumentation amplifier having gain error correction may comprise: an input transconductor may comprise a first differential pair of transistors, and a first tail current source; a feedback transconductor may comprise a second differential pair of transistors, and a second tail current source; and a modulator circuit coupled between the first and second tail current sources, and the first and second differential pairs of transistors; wherein during a first phase state the modulator circuit couples the first tail current source to the first differential pair of transistors and the second tail current source to the second differential pair of transistors, and wherein during a second phase state the modulator circuit couples the first tail current source to the second differential pair of transistors, and the second tail current source to the first differential pair of transistors.

BRIEF DESCRIPTION OF THE DRAWINGS

A more complete understanding of the present disclosure may be acquired by referring to the following description taken in conjunction with the accompanying drawings wherein.

Figure 1:
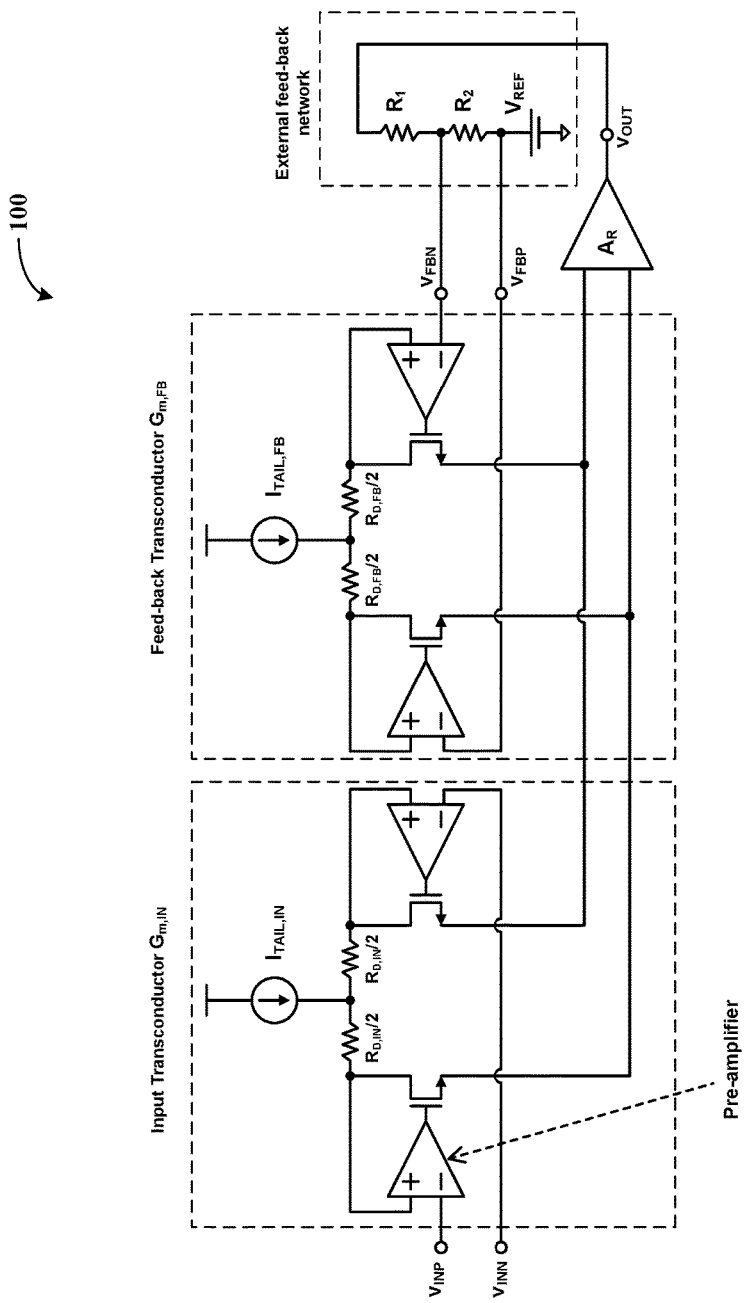
FIG. 1 illustrates a schematic diagram of a prior art current-feedback instrumentation amplifier that uses preamplifiers.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

In accordance with some embodiments of the disclosed subject matter, the present disclosure provides a current feed-back instrumentation amplifier (CFIA) fabricated on an integrated circuit die and comprising a circuit architecture that is based on a differential pair with degeneration. The present CFIA includes a modulator circuit that reduces the contribution to the CFIA's gain error of random mismatch between the tail currents of the input and feedback transconductors. The modulator circuit operates on a clock cycle to periodically swap the tail currents of each transconductor with each other. As a result, even if the tail currents are mismatched, on average the tail currents (related to the transconductor gain) will be approximately equal, and the contribution of the tail current difference to the gain error is canceled out.

The present disclosure is directed toward an architecture for a CFIA comprising differential pair transistors with degeneration for amplifying small differential voltages in the presence of large common-mode voltages. The present architecture employs "chopping" (e.g., dynamic correction) of the tail current sources for each transconductor to average out the tail current values in each transconductor, reducing mismatch and improving overall gain error and linearity. To dynamically correct the tail currents, the device includes a modulator circuit electrically coupled between the tail currents to input and feedback transconductors. The modulator circuit may include a circuit comprising four switches that operate in two phases controlled by a clock signal: in phase 1, the switches allow the corresponding tail current to flow into each transconductor; in phase 2, the switches operate to swap the tail currents, so that the previous input tail current flows into the feedback transconductor and the previous feedback tail current flows into the input transconductor.

Referring now to the drawings, the details of example embodiments are schematically illustrated. Like elements in the drawings will be represented by like numbers, and similar elements will be represented by like numbers with a different lower-case letter suffix.

Figure 2:
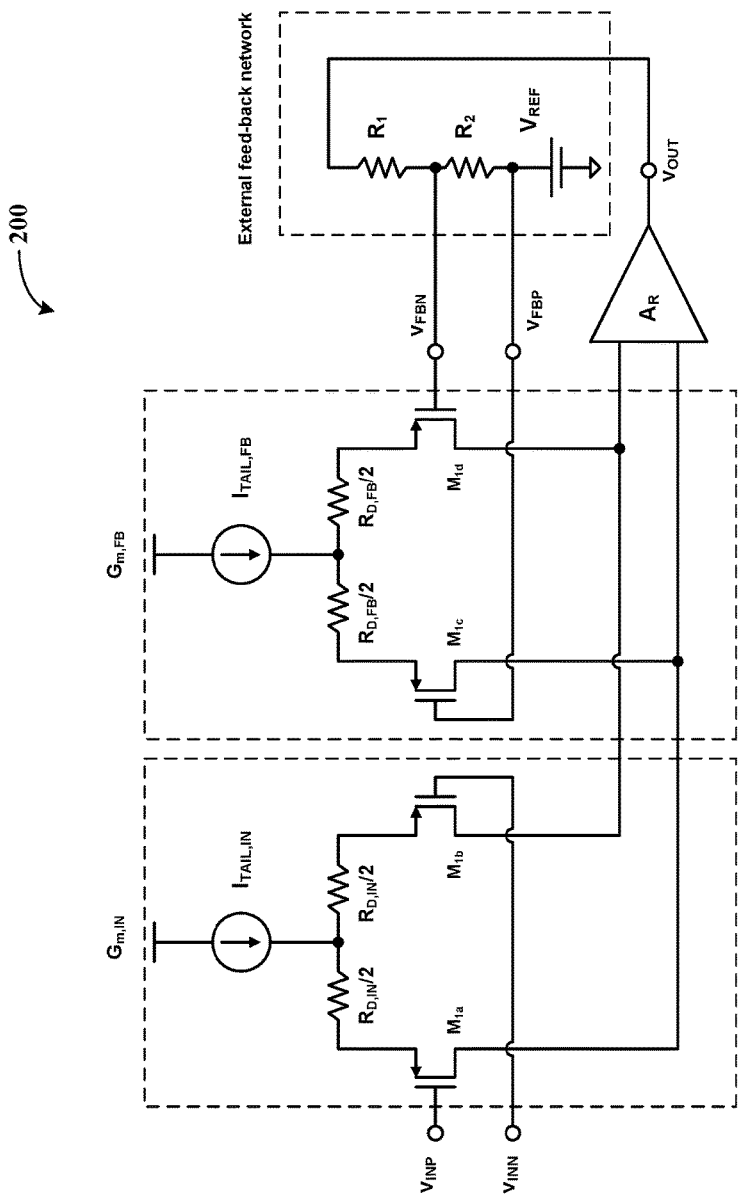
FIG. 2 illustrates a schematic diagram of a prior art current-feedback instrumentation amplifier with degenerated differential pairs.

Referring now to FIG. 2, depicted is a schematic diagram of a prior art current-feedback instrumentation amplifier. An example current-feedback instrumentation amplifier (CFIA), generally represented by the numeral 200, may use a differential pair with degeneration architecture. The CFIA 200 includes an input transconductor $G_{m,IN}$ that operates on differential input voltages $V_{INP}$ and $V_{INN}$, and a feedback transconductor $G_{m,FB}$ that operates on feedback voltages $V_{FBN}$ and $V_{FBP}$. Each transconductor ($G_{m,IN}$ and $G_{m,FB}$) has a tail current source $I_{TAIL,IN}$ and $I_{TAIL,FB}$, respectively. Each transconductor ($G_{m,IN}$ and $G_{m,FB}$) includes degeneration resistors $R_{D,IN}$ and $R_{D,FB}$, respectively. A first pair of transistors $M_{1a}$ and $M_{1b}$ (for $G_{m,IN}$), and a second pair of transistors $M_{1c}$ and $M_{1d}$ (for $G_{m,FB}$). Both transconductors ($G_{m,IN}$ and $G_{m,FB}$) are coupled together and output a signal to an amplifier AR as shown in FIG. 2.

The gain of the CFIA may be defined as Gain=$G_{m,IN}$/$G_{m,FB}$*(1+$R_1$/$R_2$) and the Gain error=$G_{m,IN}$/$G_{m,FB}$−1, where it is assumed the matching between the external resistors $R_1$ and $R_2$ is much better than the match between $G_{m,IN}$ and $G_{m,FB}$. For the CFIA 200, $$G_{m,IN} = \frac{g_{m1ab}}{2 + g_{m1ab}R_{D,IN}} \text{ and } G_{m,FB} = \frac{g_{m1cd}}{2g_{m1cd}R_{D,FB}},$$

where $g_{m1ab}$ is the transconductance of transistors $M_{1a}$ and $M_{1b}$, and $g_{m1cd}$ is the transconductance of transistors $M_{1b}$ and $M_{1d}$, and $R_{D,IN}$ and $R_{D,FB}$ have already been defined above. For simplicity, it is assumed there is no mismatch between $M_{1a}$ and $M_{1b}$ and they have the same transconductance, $g_{m1ab}$. Likewise, it is assumed there is no mismatch between $M_{1c}$ and $M_{1d}$ and they have the same transconductance $g_{m1cd}$. For convenience, one usually choses $g_{m1ab}$=$g_{m1cd}$, and $R_{D,IN}$=$R_{D,FB}$, such that the ratio $G_{m,IN}$/$G_{m,FB}$ may be unity. For transistors operating in the sub-threshold region $$g_{m1ab} = \frac{I_{TAIL,IN}}{2n_{ab}V_{T,ab}} \text{ and } g_{m1ab} = \frac{I_{TAIL,FB}}{2n_{cd}V_{T,cd}},$$

where $I_{TAIL,IN}$ and $I_{TAIL,FB}$ are the tail currents of $G_{m,IN}$ and $G_{m,FB}$, respectively; $n_{ab}$ and $n_{cd}$ are the sub-threshold constants of transistors $M_{1a}$ and $M_{1b}$, and $M_{1c}$ and $M_{1d}$, respectively; and $V_{T,ab}$ and $V_{T,cd}$ the thermal voltages of $M_{1a}$ and $M_{1b}$, and $M_{1c}$ and $M_{1d}$, respectively. The gain error will therefore depend on the matching between $R_{D,IN}$ and $R_{D,FB}$, $I_{TAIL,IN}$ and $I_{TAIL,FB}$, $n_{ab}$ and $n_{cd}$, and $V_{T,ab}$ and $V_{T,cd}$. In the ideal case, $R_{D,IN}=R_{D,FB}$, $I_{TAIL,IN}=I_{TAIL,FB}$, $n_{ab}=n_{cd}$, $V_{T,ab}=V_{T,cd}$, and the gain error is zero This disclosure addresses the contribution of the mismatch between the two $I_{TAIL}$ currents to the overall gain error.

Although the above description was based on the assumption that the transistors $M_{1a}$, $M_{1b}$, $M_{1c}$ and $M_{1d}$ operate in the sub-threshold (or weak inversion) region, this invention is not limited to this particular region, e.g., it is equally valid for transistors operating in the saturation region.

Figure 3:
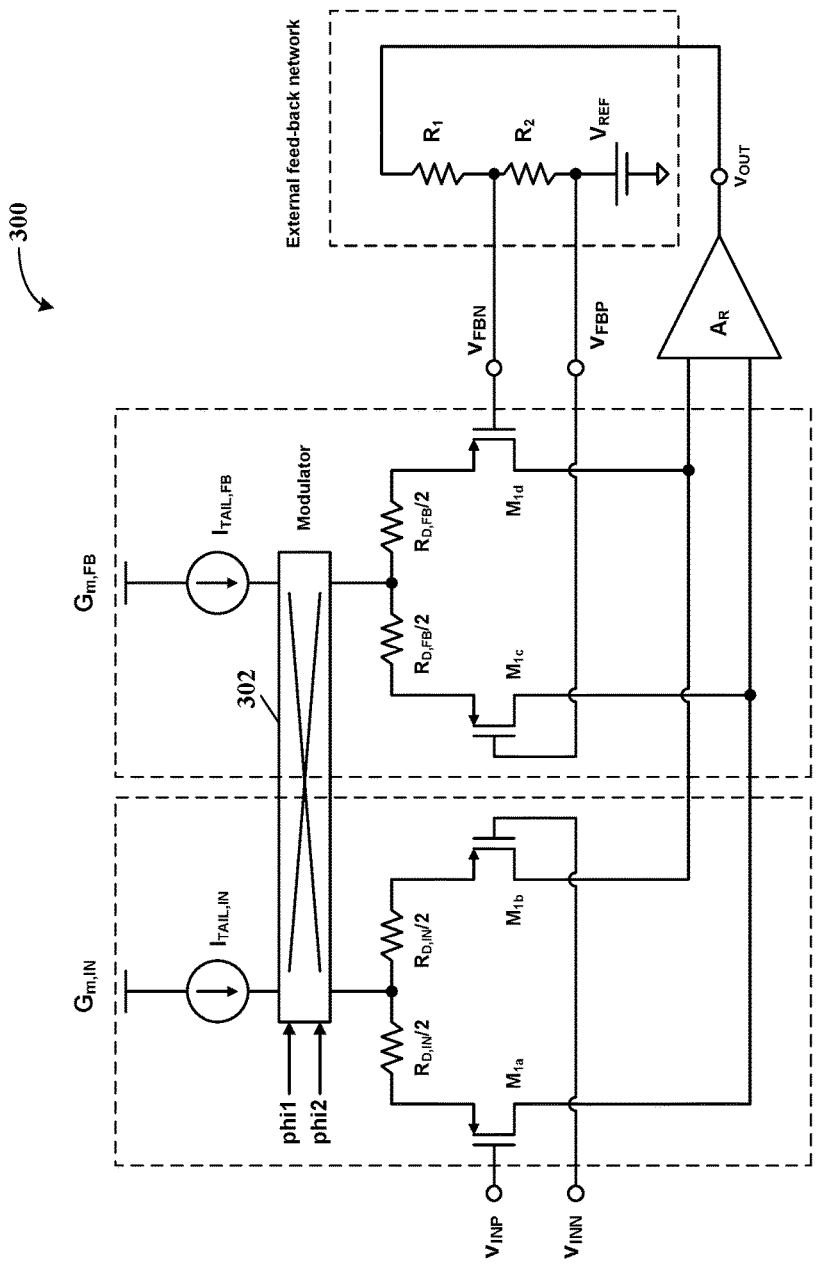
FIG. 3 illustrates a schematic diagram of a current-feedback instrumentation amplifier comprising a tail current source modulator circuit, according to a specific example embodiment of this disclosure.

Referring now to FIG. 3, depicted is a schematic diagram of a current-feedback instrumentation amplifier comprising a tail current source modulator circuit, according to a specific example embodiment of this disclosure. A CFIA, generally represented by the numeral 300, may use the circuit architecture shown in FIG. 3 to minimize or substantially eliminate the contribution of mismatch between $I_{TAIL,IN}$ and $I_{TAIL,FB}$ to the CFIA gain error. In some embodiments, the CFIA 300 may comprise the CFIA 200 architecture shown in FIG. 2 and a modulator circuit 302 disposed between the tail current sources $I_{TAIL,IN}$ and $I_{TAIL,FB}$ and the degeneration resistors $R_{D,IN}$ and $R_{D,FB}$. The modulator circuit 302 implements dynamic correction of the tail current mismatch by periodically swapping tail current sources $I_{TAIL,IN}$ and $I_{TAIL,FB}$. In some embodiments, the modulator circuit 302 may operate based on input received as one or more regulated signals phi1 and phi2, e.g., provided by a clock or another regulating circuit. In an example implementation, the regulated signals phi1 and phi2 alternately switch between low and high logic levels every half clock cycle, swapping the tail current sources between transconductors $G_{m,IN}$ and $G_{m,FB}$ twice every clock cycle. This approach allows the portion of the gain error contributed by mismatched tail currents to be continuously corrected during operation of the CFIA 300.

Figure 4A:
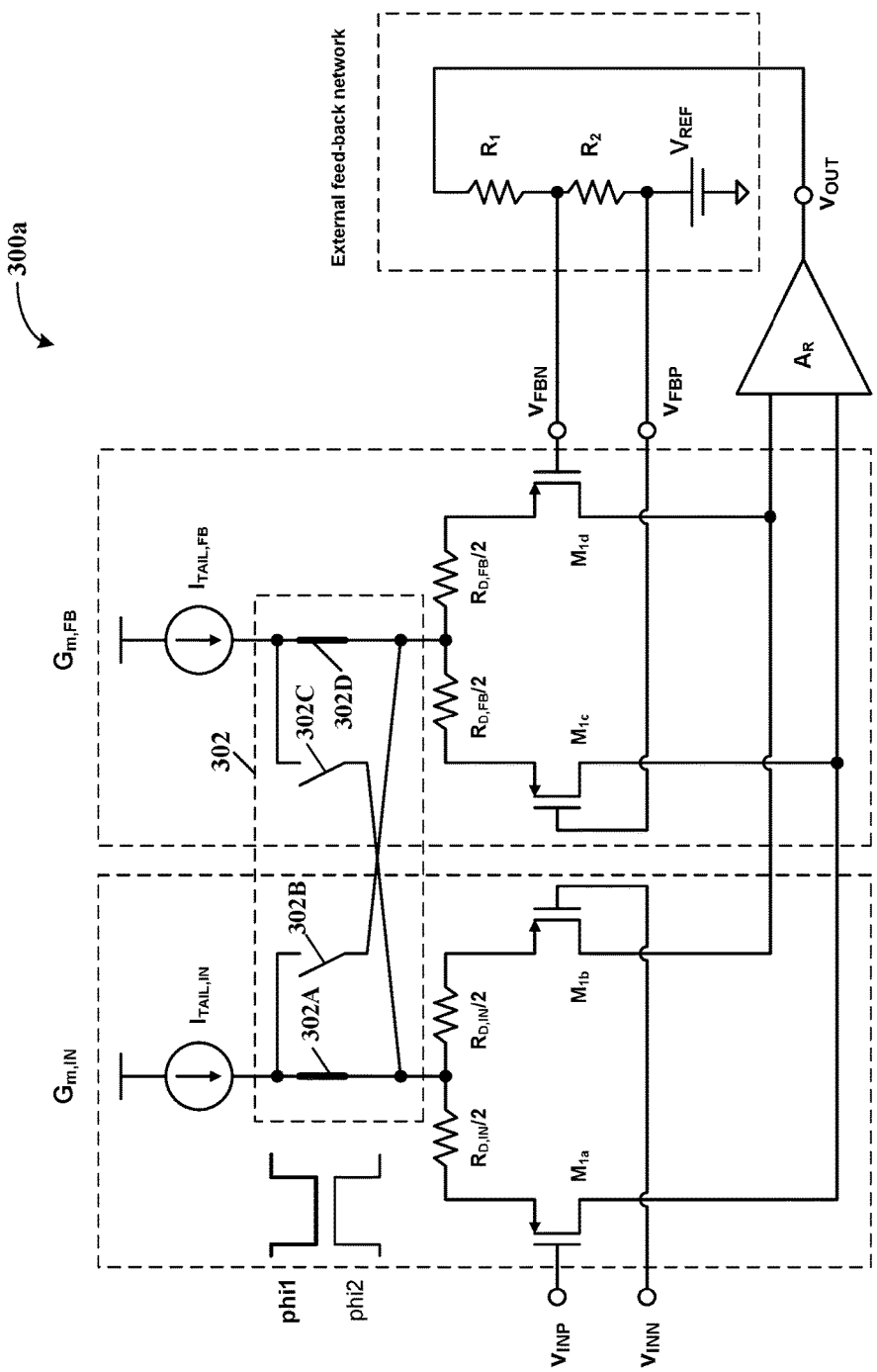
FIG. 4A illustrates a schematic diagram of the current-feedback instrumentation amplifier shown in FIG. 3 in a first phase state.
Figure 4B:
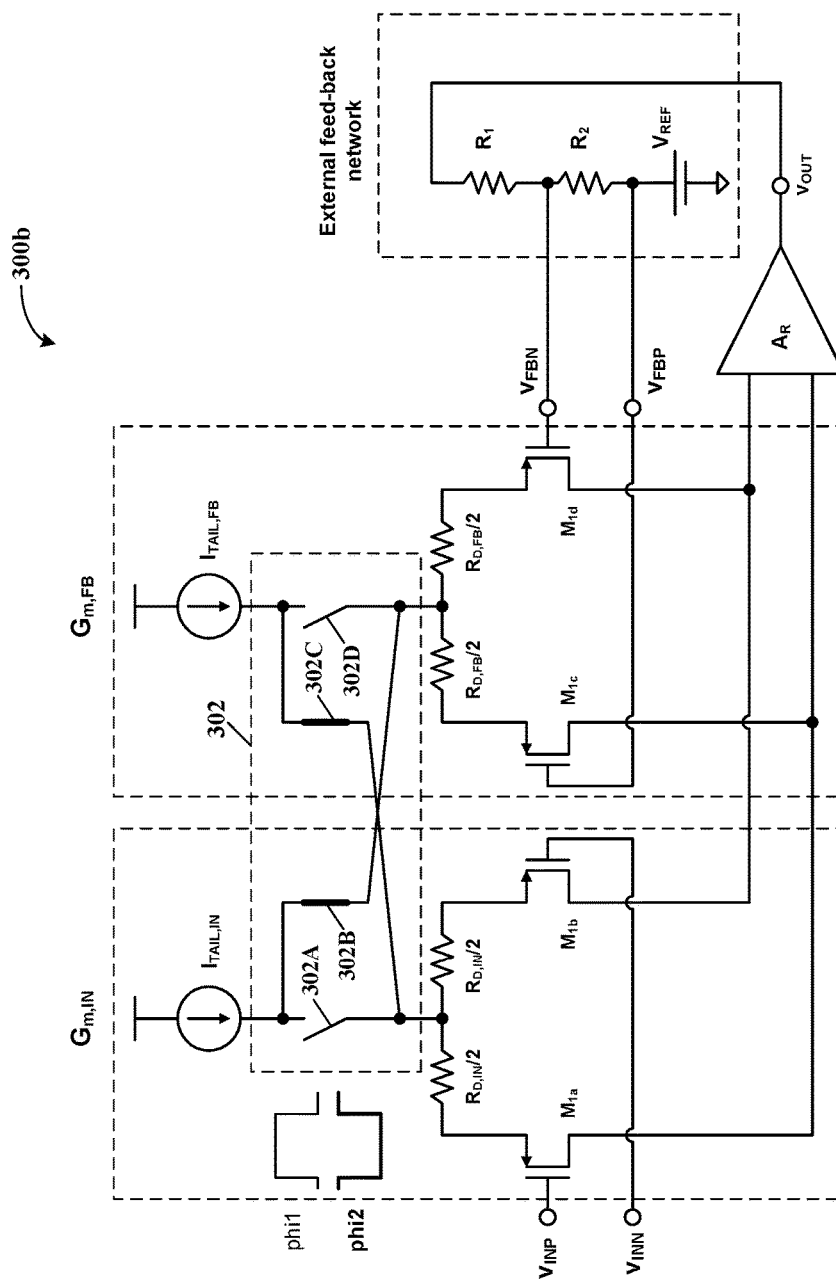
FIG. 4B illustrates a schematic diagram of the current-feedback instrumentation amplifier shown in FIG. 3 in a second phase state.

Referring to FIGS. 4A and 4B, depicted are schematic diagrams of the current-feedback instrumentation amplifier shown in FIG. 3 in first and second phase states, respectively. The modulator circuit 302 of FIG. 3, may include four switches 302A-302D that may be adapted to alternately connect each tail current, $I_{TAIL,IN}$ and $I_{TAIL,FB}$, in the transconductors $G_{m,IN}$ and $G_{m,FB}$. The regulated signals phi1 and phi2 may be provided from a clock signal and are shown to be in opposite phase, such that phi1 is low when phi2 is high, and vice-versa. As shown in FIG. 4A, when phi1 is low and phi2 is high, the "outer" switches 302A and 302D are closed, and the "inner" switches 302B and 302C are open. As shown in FIG. 4B, when the desired period (e.g., a clock cycle, clock half-cycle, etc.) elapses the values of the regulated signals phi1, phi2 flip; whereby phi1 is high and phi2 is low, the "outer" switches 302A and 302D are open, and the "inner" switches 302B and 302C are closed.

To illustrate how the current invention corrects the effect of tail current mismatch to gain error, it may be assumed that the tail current of $G_{m,IN}$, $I_{TAIL,IN}$ has a nominal value of $I_{TAIL}$, while the tail current of transconductor $G_{m,FB}$ suffers from a random mismatch denoted by $\delta$ such that its value is $I_{TAIL,FB}=I_{TAIL}+\delta*I_{TAIL}$. During a first phase (phi1 low and phi2 high—see FIG. 4A) the "baseline" current $I_{TAIL}$ flows into the input transconductor $G_{m,IN}$ and the mismatched tail current $(1+\delta)*I_{TAIL}$ flows into the feedback transconductor $G_{m,FB}$. The transconductance of transistors $M_{1a}$ and $M_{1b}$, $g_{m1ab}$ will have a nominal value equal to $g_m$, while the transconductance of $M_{1c}$ and $M_{1d}$ will suffer from an equal mismatch, $\delta$, $g_{m1cd}=g_m+\delta*g_m$; $G_{m,IN}$ will be equal to a nominal value $G_m$, while $G_{m,FB}$ will be approximately equal to $G_m(1+\delta)$. Therefore, during this phase, the gain error will be approximately $-\delta$. Then in the second phase (phi1 high and phi2 low—see FIG. 4B) the modulator circuit 302 switches the tail current sources, and the baseline current $I_{TAIL}$ flows into the feedback transconductor $G_{m,FB}$ and the mismatched tail current $(1+\delta)*I_{TAIL}$ flows into the input transconductor $G_{m,IN}$. During this cycle, $G_{m,IN}$ will be $G_m(1+\delta)$, $G_{m,FB}$ will be equal to $G_m$, and the gain error will be approximately $+\delta$. If during one half clock cycle, the gain error is $-\delta$, and during the other half clock cycle $+\delta$, over a complete clock cycle the gain error will be on average zero. Thus, the modulator circuit 302 provides a continuous correction of the gain error during CFIA 300 operation.

Additionally, the implemented architecture provides other operative advantages, including without limitation: low noise-to-power ratio, substantially no effect of temperature or process variation on functionality; no post-production trimming of components required; reduced test time and cost; area-efficient architecture, requiring as new components only four switches comprising the modulator circuit, using existing infrastructure such as oscillators and ripple filters for offset voltage (caused by swapping tail currents) correction, and not needing additional memory (e.g., non-volatile memory to store trimming values).

Additionally, various embodiments of the present CFIA architecture are suitable for high-voltage designs, even when the difference between the common-mode voltage on the input pins $V_{INP}$ and $V_{INN}$, and the common-mode voltage on the feedback pins $V_{FBP}$ and $V_{FBN}$ is large (e.g., over five (5) volts).

Figure 5B:
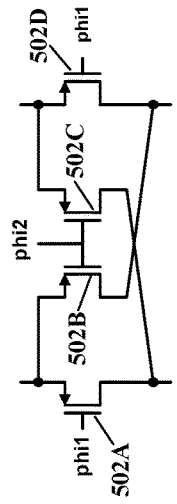
FIG. 5B illustrates a schematic diagram of an example modulator circuit for use in the current-feedback instrumentation amplifiers of FIGS. 3 and 5A.
Figure 5B:
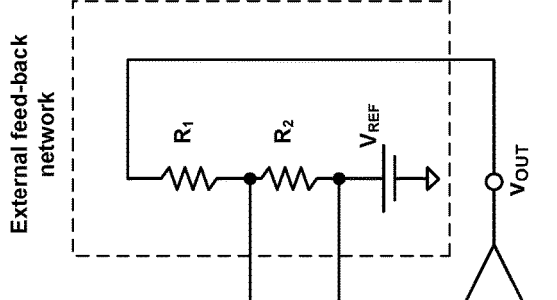
Figure 5A:
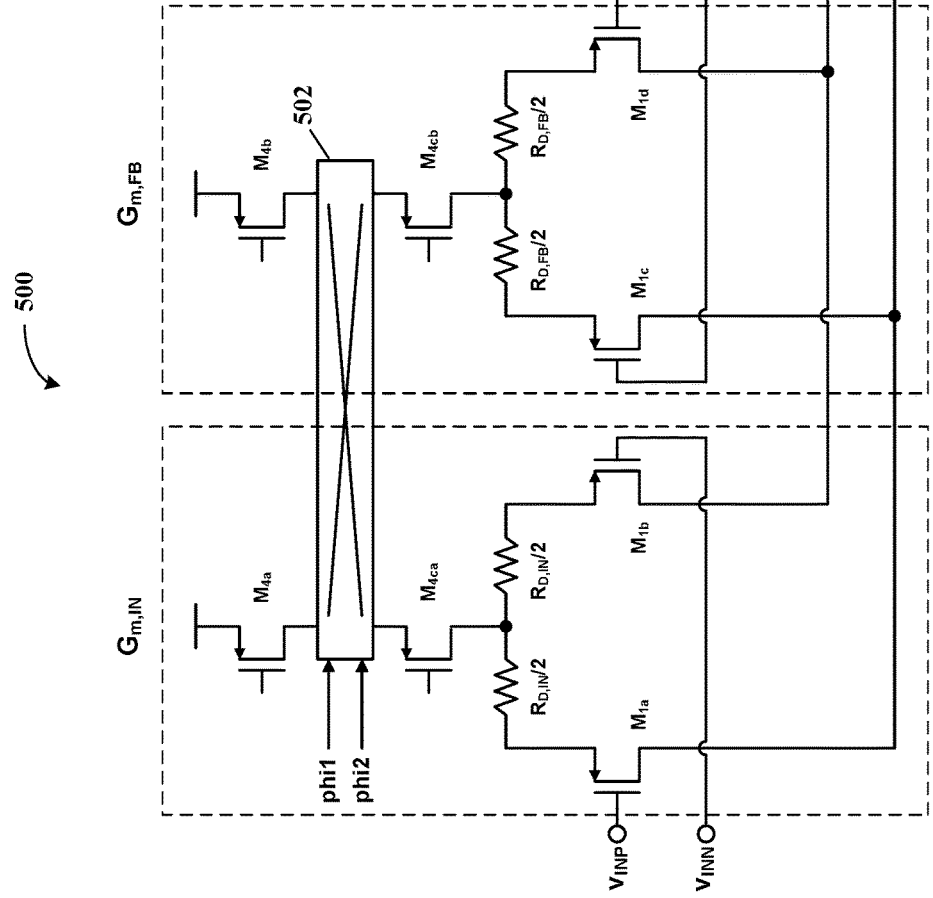
FIG. 5A illustrates a schematic diagram of a current-feedback instrumentation amplifier comprising a tail current source modulator circuit placed between low-impedance nodes, according to another specific example embodiment of this disclosure.

Referring to FIG. 5A, depicted is a schematic diagram of a current-feedback instrumentation amplifier comprising a tail current source modulator circuit placed between low-impedance nodes, according to another specific example embodiment of this disclosure. In the CFIA architecture, generally represented by the numeral 500, a modulator circuit 502 swaps tail current sources between transconductors $G_{m,IN}$ and $G_{m,FB}$ in accordance with the description of the circuit architecture shown in FIG. 3.

Referring to FIG. 5B, depicted is a schematic diagram of an example modulator circuit for use in the current-feedback instrumentation amplifiers of FIGS. 3 and 5A. As shown in FIGS. 5A and 5B, the modulator circuit 502 may be placed between low-impedance nodes (e.g., between transistors $M_{4a}$ and $M_{4ca}$, and $M_{4b}$ and $M_{4cb}$) that carry the tail currents of the respective transconductors. For example, switch 502A may be disposed between transistors $M_{4a}$ and $M_{4ca}$, switch 502B may be disposed between transistors $M_{4a}$ and $M_{4cb}$, switch 502C may be disposed between transistors $M_{4b}$ and $M_{4ca}$, and switch 502D may be disposed between transistors $M_{4b}$ and $M_{4cb}$; to control the flow of the tail currents as described above with respect to the modulator circuit 302 of FIGS. 3A and 3B. The low-impedances between the transistors $M_{4a}$ and $M_{4ca}$, and $M_{4b}$ and $M_{4cb}$ may be maintained at substantially equal electrical potentials regardless of the common mode voltages of nodes $V_{INP}$ and $V_{INN}$, and $V_{FBP}$ and $V_{FBN}$ on the respective transconductors. In one embodiment, substantially equal potentials may be maintained through the operation of cascode transistors $M_{4ca}$ and $M_{4cb}$ on both the input and output sides of the modulator circuit 502. The switches 502 may be transistors 502A-502D, and these transistors may be metal oxide semiconductor field effect transistors (MOSFETs). Likewise, transistors $M_{4a}$, $M_{4ca}$, $M_{4b}$ and $M_{4cb}$ may be MOSFETs.

Figure 6:
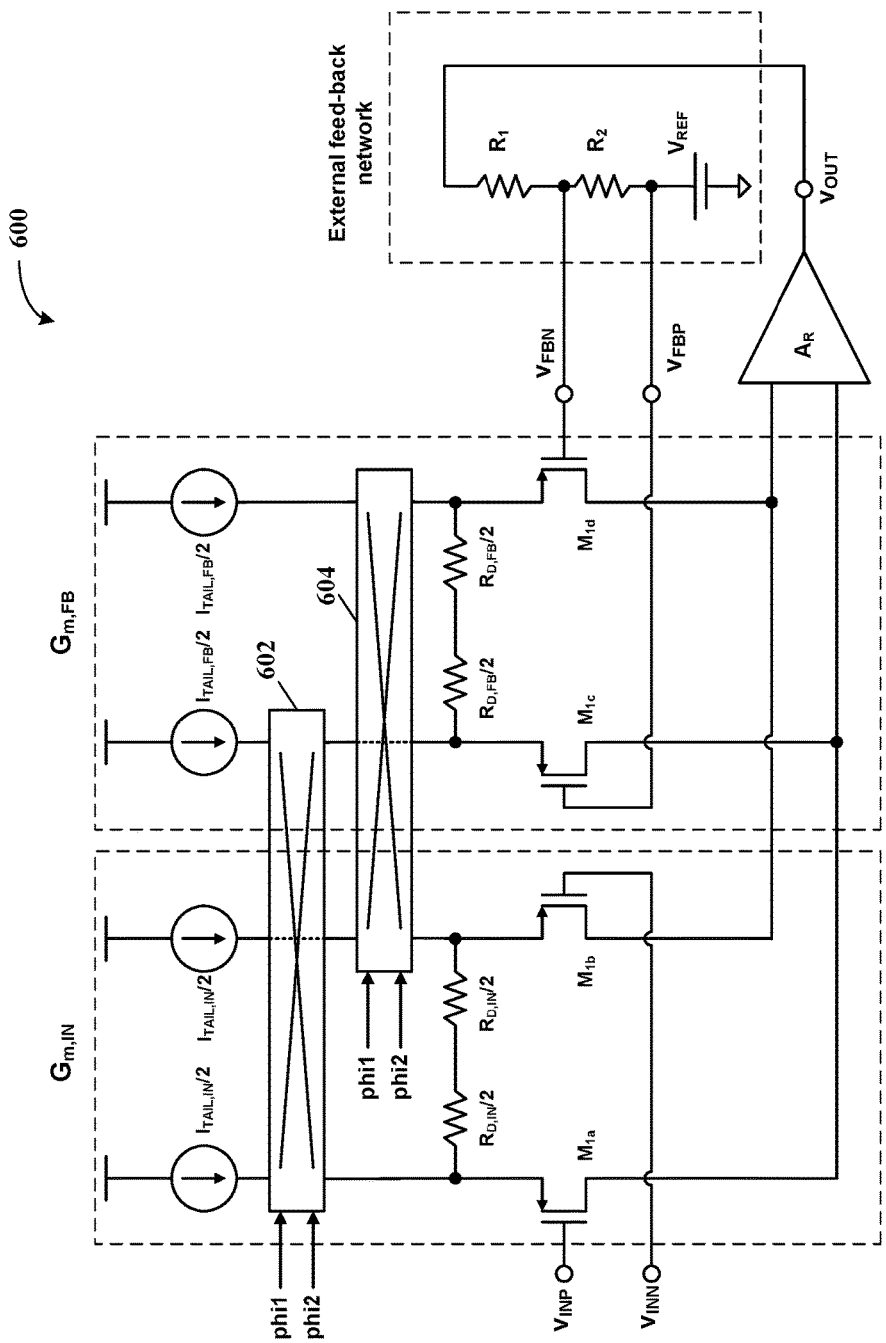
FIG. 6 illustrates a schematic diagram of a current-feedback instrumentation amplifier comprising modulator circuits and split tail current sources, according to yet another specific example embodiment of this disclosure.

Referring to FIG. 6, depicted is a schematic diagram of a current-feedback instrumentation amplifier comprising modulator circuits and split tail current sources, according to yet another specific example embodiment of this disclosure. A CFIA, generally represented by the numeral 600, may use the circuit architecture shown to minimize or substantially eliminate the CFIA gain error from the mismatches between the tail currents to the transconductor $G_{m,IN}$, and the transconductor $G_{m,FB}$. Instead of using one tail current source for each of the transconductors, and splitting (dividing by two through resistors $R_D/2$) the current from each tail current source to the differential transistor pairs, two tail current sources for each transconductor, one for each of the differential pair transistors of a transconductor may be provided.

The modulator circuits 602 and 604 implement dynamic correction, as more fully described in FIGS. 3, 4A and 4B above, of the tail current mismatch by periodically swapping each of tail current sources of the input transconductor and the feedback transconductor; thus, during one period the "baseline" tail currents $I_{TAIL,IN}/2$ flow into each of the transistors comprising the input transconductor $G_{m,IN}$ and the mismatched tail currents $I_{TAIL,FB}$ flow into each of the transistors comprising the feedback transconductor $G_{m,FB}$, then the modulator circuits 602 and 604 switch the tail current sources, and during the next period the baseline currents $I_{TAIL,IN}/2$ flow into each of the transistors comprising the feedback transconductor $G_{m,FB}$ and the mismatched tail currents $I_{TAIL,FB}$ flow into each of the transistors comprising the input transconductor $G_{m,IN}$. In some embodiments, the modulator circuits 602 and 604 may operate based on inputs received as one or more regulated signals phi1 and phi2, e.g., provided by a clock or another regulating circuit. In an example implementation, the regulated signals phi1 and phi2 alternately switch between low and high logic levels every half clock cycle, swapping the tail current sources between transconductors $G_{m,IN}$ and $G_{m,FB}$ twice every clock cycle; during one half clock cycle, the gain error will be roughly equal to $-\delta$, and during the other half clock cycle, the gain error will be roughly equal to $+\delta$, so that the gain error over a complete clock cycle averages out to zero. This approach allows the portion of the gain error contributed by mismatched tail currents to be continuously corrected during operation of the CFIA 600.

Figure 7:
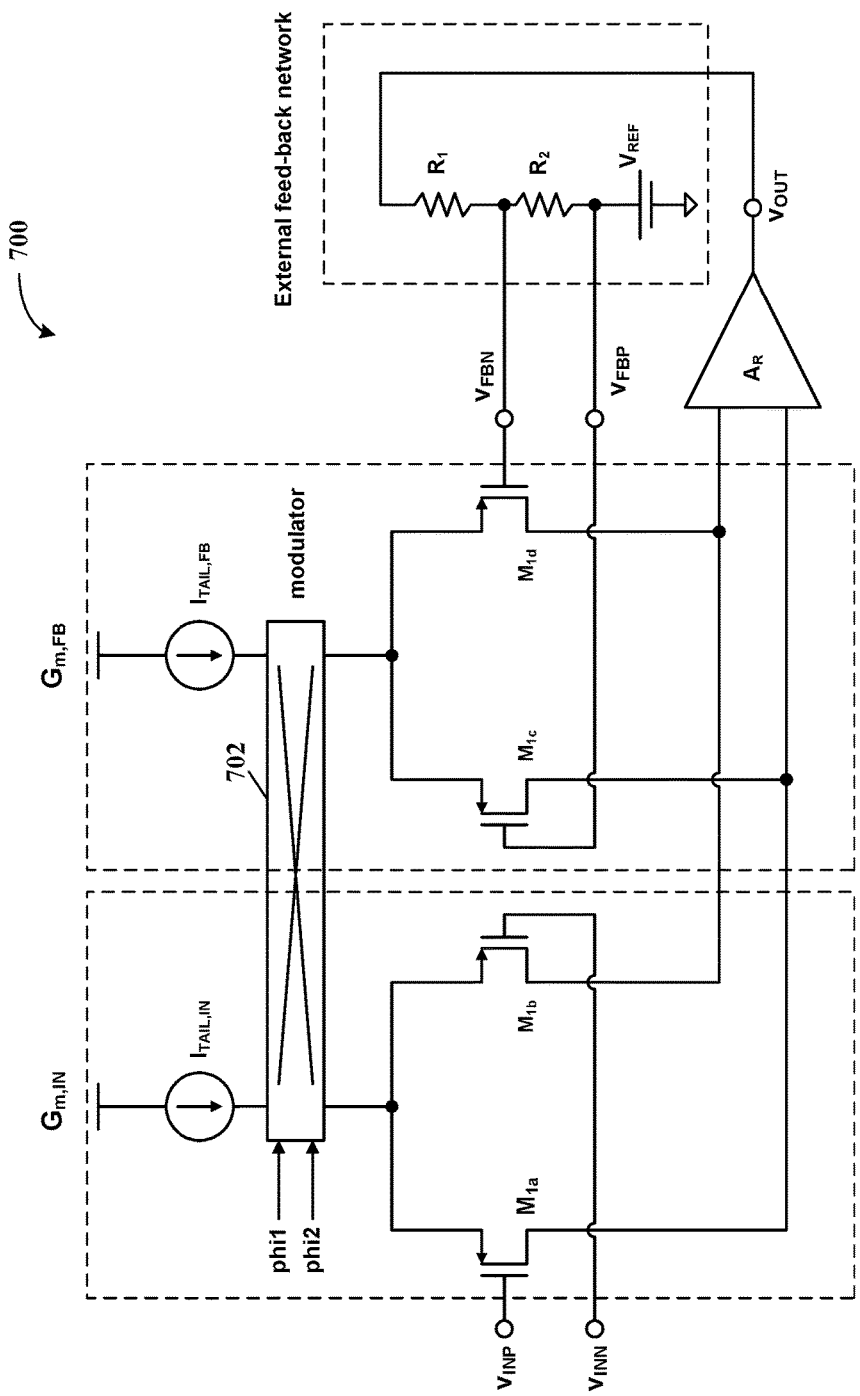
FIG. 7 illustrates a schematic diagram of a current-feedback instrumentation amplifier without degeneration resistors and comprising a tail current source modulator circuit, according to still another specific example embodiment of this disclosure.

Referring to FIG. 7, depicted is a schematic diagram of a current-feedback instrumentation amplifier without degeneration resistors and comprising a tail current source modulator circuit, according to still another specific example embodiment of this disclosure. Tail current swapping can be effective for reducing gain error even without the degeneration resistors used in the CFIAs 300, 500 and 600. Operation of the CFIA 700 shown in FIG. 7 operates in substantially the same fashion as the CFIA 300 described hereinabove, but is configured without degeneration resistors $R_D$ (FIG. 3).

Figure 8:
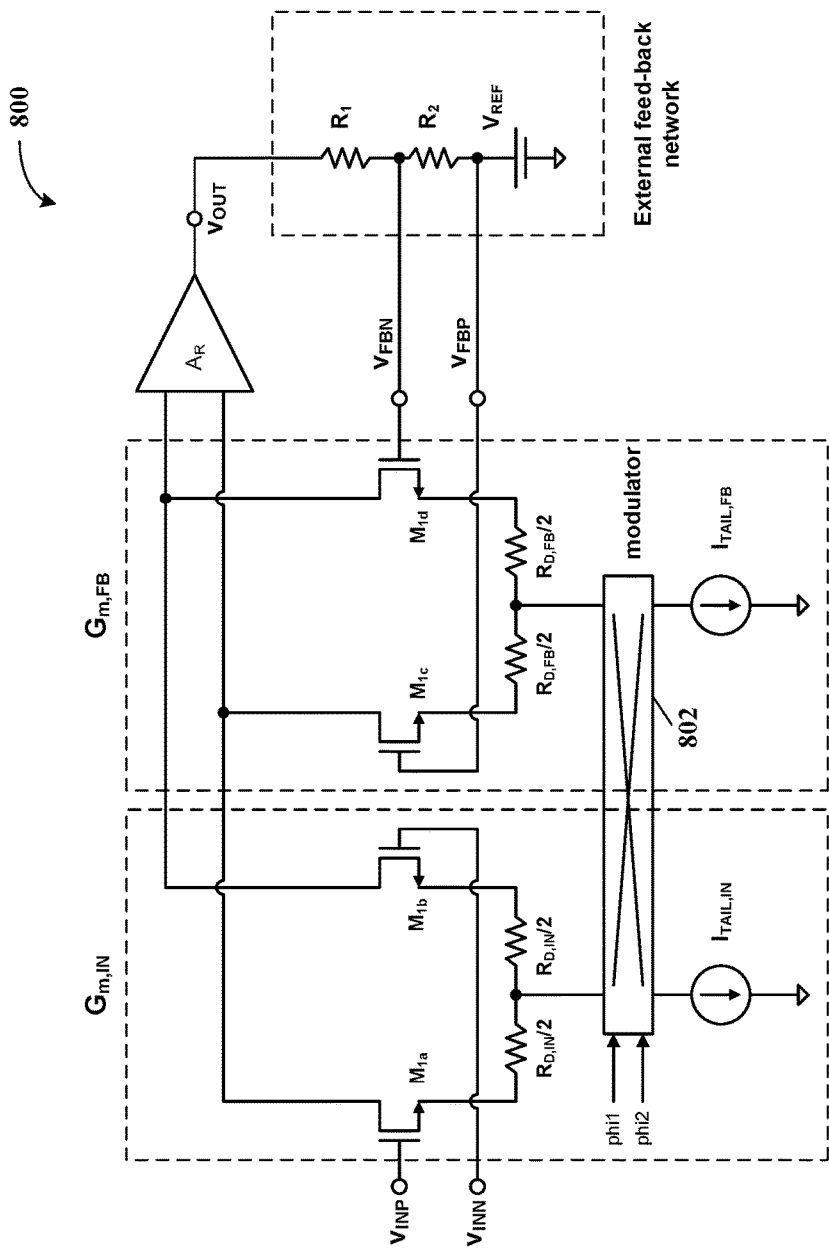
FIG. 8 illustrates a schematic diagram of a current-feedback instrumentation amplifier comprising a tail current source modulator circuit, according to another specific example embodiment of this disclosure.

Referring to FIG. 8, depicted is a schematic diagram of a current-feedback instrumentation amplifier comprising a tail current source modulator circuit, according to another specific example embodiment of this disclosure. The CFIA 800 shown in FIG. 8 is configured and operates in substantially the same fashion as the CFIA 300 described hereinabove, but its architecture comprises N-channel MOSFETS instead of P-channel MOSFETS (FIG. 3).

Figure 9:
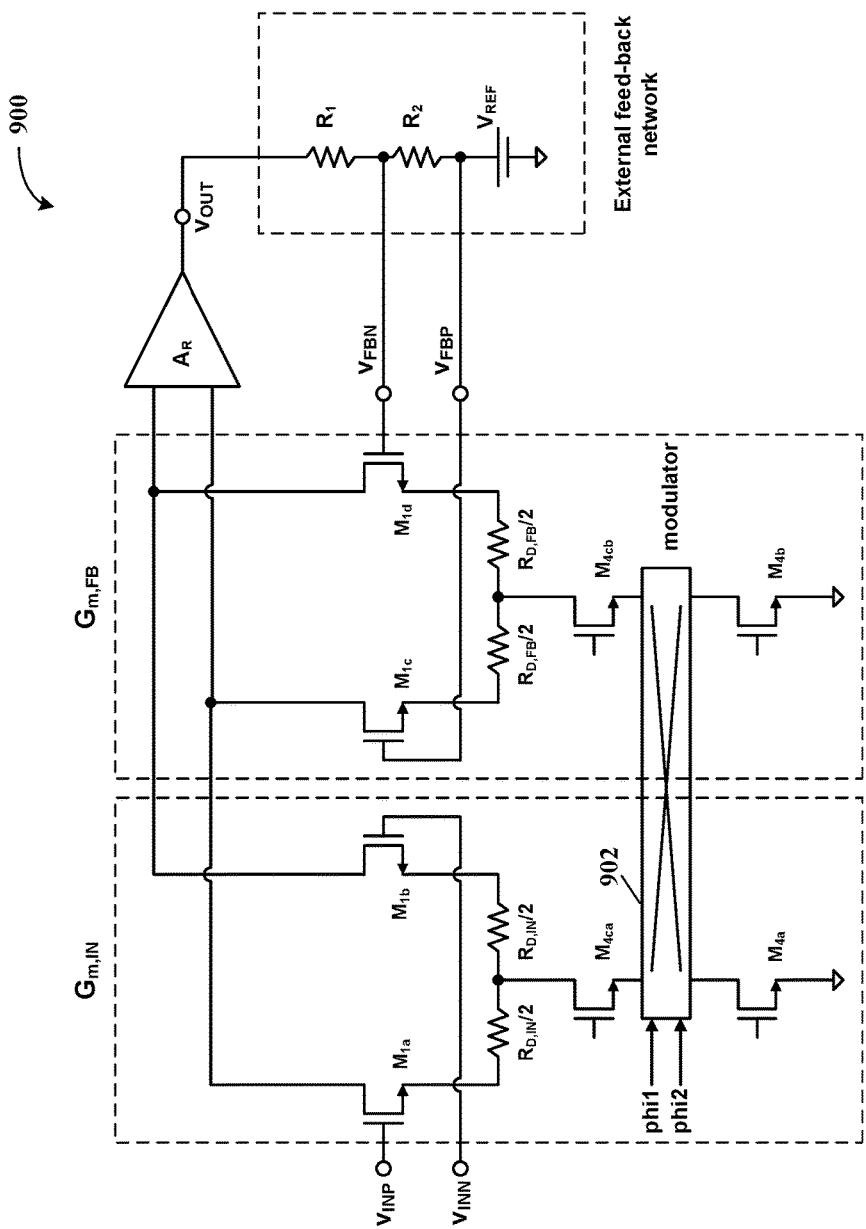
FIG. 9 illustrates a schematic diagram of a current-feedback instrumentation amplifier comprising a tail current source modulator circuit placed between low-impedance nodes, according to still yet another specific example embodiment of this disclosure.

Referring to FIG. 9, depicted is a schematic diagram of a current-feedback instrumentation amplifier comprising a tail current source modulator circuit placed between low-impedance nodes, according to still yet another specific example embodiment of this disclosure. The CFIA 900 shown in FIG. 9 is configured and operates in substantially the same fashion as the CFIA 500 described hereinabove, but its architecture comprises N-channel MOSFETS instead of P-channel MOSFETS (FIG. 5).

The present invention has been described in terms of one or more preferred embodiments, and it should be appreciated that many equivalents, alternatives, variations, and modifications, aside from those expressly stated (e.g., methods of manufacturing, product by process, and so forth), are possible and within the scope of the invention.

What is claimed is:

1. A method for gain error correction in a current-feedback instrumentation amplifier, said method comprising the steps of:
    providing an input transconductor comprising
        a first differential pair of transistors,
        first degeneration resistors coupled to the first differential pair of transistors, and
        a first tail current source;
    providing a feedback transconductor comprising
        a second differential pair of transistors,
        second degeneration resistors coupled to the second differential pair of transistors, and
        a second tail current source; and
    providing a modulator circuit coupled between the first and second tail current sources, and the first and second degeneration resistors;
    controlling the modulator circuit by alternating first and second phase signals;
    wherein during the first phase signal comprises the steps of coupling the first tail current source to the first degeneration resistors and the second tail current source to the second degeneration resistors with the modulator circuit; and
    wherein during the second phase signal comprises the steps of coupling the first tail current source to the second degeneration resistors, and the second tail current source to the first degeneration resistors with the modulator circuit.

2. The method according to claim 1, wherein gain error caused by a difference between the first and second tail current sources is averaged out during the first and second phases.

3. The method according to claim 1, further comprising the steps of:
    coupling the input and feedback transconductors to an amplifier; and
    coupling a feedback network between an output of the amplifier and inputs of the feedback transconductor.

4. The method according to claim 3, wherein the feedback network determines gain of the current-feedback instrumentation amplifier.

5. A current-feedback instrumentation amplifier having gain error correction, comprising:
    an input transconductor comprising
        a first differential pair of transistors,
        first degeneration resistors coupled to the first differential pair of transistors, and
        a first tail current source;
    a feedback transconductor comprising
        a second differential pair of transistors,
        second degeneration resistors coupled to the second differential pair of transistors, and
        a second tail current source; and a modulator circuit coupled between the first and second tail current sources, and the first and second degeneration resistors;

wherein during a first phase state the modulator circuit couples the first tail current source to the first degeneration resistors and the second tail current source to the second degeneration resistors; and wherein during a second phase state the modulator circuit couples the first tail current source to the second degeneration resistors, and the second tail current source to the first degeneration resistors.

6. The current-feedback instrumentation amplifier according to claim 5, wherein gain error caused by a difference between the first and second tail current sources is averaged out during the first and second phases.

7. The current-feedback instrumentation amplifier according to claim 5, further comprising:
an amplifier having inputs coupled to outputs from the input and feedback transconductors; and
a feedback network coupled between an output of the amplifier and inputs of the feedback transconductor.

8. The current-feedback instrumentation amplifier according to claim 7, wherein the feedback network comprises:
a first feedback resistor;
a second feedback resistor; and
a voltage reference;
the first and second feedback resistors and the voltage reference are connected in series;
a first input of the feedback transconductor is coupled to a node between the second feedback resistor and the voltage reference;
a second input of the feedback transconductor is coupled to a node between the first feedback resistor and the second feedback resistor; and
the output of the amplifier is coupled to the first feedback resistor;
wherein gain is determined by a ratio of resistance values of the first and second feedback resistors.

9. The current-feedback instrumentation amplifier according to claim 5, wherein the input transconductor has a positive input and a negative input.

10. The current-feedback instrumentation amplifier according to claim 5, wherein the modulator circuit comprises:
a first switch coupled between the first tail current source and the first degeneration resistors;
a second switch coupled between the first tail current source and the second degeneration resistors;
a third switch coupled between the second tail current source and the first degeneration resistors; and
a fourth switch coupled between the second tail current source and the second degeneration resistors;
wherein
the first and fourth switches are closed and the second and third switches are open on a first phase state control signal; and
the second and third switches are closed and the first and fourth switches are open on a second phase state control signal.

11. The current-feedback instrumentation amplifier according to claim 10, wherein the first and second phase state control signals are from a clock generator, wherein the first control signal is at a first logic level and the second control signal is at a second logic level.

12. The current-feedback instrumentation amplifier according to claim 10, wherein the first, second, third and fourth switches are metal oxide semiconductor field effect transistors (MOSFETs).

13. The current-feedback instrumentation amplifier according to claim 12, wherein the MOSFETs are P-channel MOSFETs.

14. The current-feedback instrumentation amplifier according to claim 12, wherein the MOSFETs are N-channel MOSFETs.

15. The current-feedback instrumentation amplifier according to claim 5, further comprising transistors at inputs and outputs of the modulator circuit for providing low impedance nodes to maintain substantially equal electrical potentials thereon regardless of input voltages to the input and feedback transconductors.

16. The current-feedback instrumentation amplifier according to claim 5, wherein the input and feedback transconductors are fabricated on an integrated circuit die.

\* \* \* \* \*